(12) United States Patent
Quinn

(10) Patent No.: US 8,618,787 B1
(45) Date of Patent: Dec. 31, 2013

(54) CURRENT MIRROR AND HIGH-COMPLIANCE SINGLE-STAGE AMPLIFIER

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 352 days.

(21) Appl. No.: 12/970,285

(22) Filed: Dec. 16, 2010

(51) Int. Cl.
*G05F 3/16* (2006.01)

(52) U.S. Cl.
USPC ............................................. 323/316

(58) Field of Classification Search
USPC ............................ 323/312–316; 327/538–541
See application file for complete search history.

(56) References Cited

U.S. PATENT DOCUMENTS

2007/0241819 A1* 10/2007 Dake et al. ..................... 330/257

OTHER PUBLICATIONS

Angulo et al. (A power efficient and simple scheme for dynamically biasing cascade amplifiers and telescopic op-amps, Jan. 1, 2008).*
Ledesma, Francisco et al., "Comparison of New and Conventional Low Voltage Current Mirrors," *Proc. of the 2002 45th IEEE Midwest Symposium on Circuits and Systems*, Aug. 4, 2002, pp. II-49-II-52, IEEE, New York, New York, USA.
Rajput, S. S. et al., "Advanced Current Mirros for Low Voltage Analog Designs," *Proc. of the 2004 IEEE International Conference on Semiconductor Electronics*, Dec. 7, 2004, pp. 258-263, IEEE, Piscataway, New Jersey, USA.
Praneeth, Sai et al., "A Self Biased Operational Amplifier at Ultra Low Power Supply Voltage," *Proc. of the 2009 16th IEEE Conference on Electronics, Circuits, and Systems*, Dec. 13, 2009, pp. 152-154, IEEE, Piscataway, New Jersey, USA.
Ramírez-Angulo Jaime et al., "A power efficient and simple scheme for dynamically biasing cascode amplifiers and telescopic op-amps," *Integration, the VLSI Journal*, Jul. 2008, pp. 539-543, vol. 41, Issue 4, Elsevier Science Publishers B. V., Amsterdam, The Netherlands.
Sehgal, Rohan et al., "A 0.8V Operational Amplifier using Floating Gate MOS Technology," *Proc. of the 2006 IEEE International Conference on Semiconductor Electronics*, Oct. 29, 2006, pp. 795-799, IEEE, Piscataway, New Jersey, USA.

* cited by examiner

*Primary Examiner* — Adolf Berhane
*Assistant Examiner* — Yemane Mehari
(74) *Attorney, Agent, or Firm* — Kevin T. Cuenot; Gerald Chan; Lois D. Cartier

(57) ABSTRACT

A system for use within an integrated circuit (IC) can include an input differential pair including a positive input node and a negative input node, a current source coupled to the input differential pair, and a current mirror. The current mirror can include at least a first active device and a second active device. The system can include a biasing transistor device having a source terminal coupled to a gate terminal of each of the first and second active devices, a gate terminal coupled to a drain terminal of the second active device, and a drain terminal coupled to a voltage source. The biasing transistor device is complementary to the current mirror.

20 Claims, 5 Drawing Sheets

US 8,618,787 B1

CURRENT MIRROR AND HIGH-COMPLIANCE SINGLE-STAGE AMPLIFIER

FIELD OF THE INVENTION

One or more embodiments disclosed within this specification relate to integrated circuits (ICs). More particularly, one or more embodiments relate to a current mirror and an amplifier for use within an IC.

BACKGROUND

Modern integrated circuit (IC) manufacturing technologies allow circuits to be created using devices that continue to shrink in size. The circuit characteristics of smaller devices, however, can inhibit the development of a quality amplifier design. Achieving desired operating characteristics such as output impedance and high gain within an amplifier can be difficult as transistor devices decrease in size.

These difficulties can be exacerbated when designing a single-stage amplifier. When designing a single-stage amplifier, rather than relying upon multiple stages to achieve desired operating characteristics, operating characteristics such as impedance and gain must be achieved within a single amplification stage while contending with design issues relating to device size. Single-stage amplifiers do, however, have benefits. For example, single-stage amplifiers avoid compensation requirements introduced by multiple amplifier stages. In addition, single-stage amplifiers typically consume less die area than multistage amplifiers.

SUMMARY

One or more embodiments disclosed within this specification relate to integrated circuits (ICs) and, more particularly, to a current mirror and an amplifier for use within an IC.

An embodiment can include a system for use within an IC. The system can include an input differential pair including a positive input node and a negative input node and a current source coupled to the input differential pair. The current source can provide a predetermined bias current. The system also can include a current mirror including a first active device and a second active device. A drain terminal of the first active device can include an output node. The system further can include a biasing transistor device including a source terminal coupled to a gate terminal of each of the first and second active devices, a gate terminal coupled to a drain terminal of the second active device, and a drain terminal coupled to a voltage source. The biasing transistor device can be complementary to the current mirror.

The input differential pair can be implemented as a cascoded input differential pair including a first input transistor device coupled in series with a first cascode input transistor device and a second input transistor device coupled in series with a second cascode input transistor device. The cascoded input differential pair further can include a diode-connected transistor having a source terminal coupled to the source terminal of each of the first and second input transistor devices and a drain terminal coupled to a gate terminal of each of the first and second cascode input transistor devices. The diode-connected transistor can be sized according to a gate-to-source voltage of the first and second input cascode transistor devices.

The first active device can include a first transistor device and a first cascode transistor device. A gate terminal of the first transistor device can be coupled to a gate terminal of the second active device and the source terminal of the biasing transistor device. A gate terminal of the first cascode device can be coupled to a bias voltage. A drain terminal of the first cascode device can include the output node.

The second active device can include a second transistor device and a second cascode transistor device. A gate terminal of the second transistor device can be coupled to a gate terminal of the second cascode transistor device, the gate terminal of the first transistor device, and the source terminal of the biasing transistor device. A drain terminal of the second cascode transistor device can be coupled to the gate terminal of the biasing transistor device.

The system also can include an amplifier. The amplifier can include a non-inverting input node coupled to a drain terminal of the second transistor device, an inverting input node coupled to a drain terminal of the first transistor device, and an output coupled to a gate terminal of the first cascode transistor device. The amplifier can provide the bias voltage to the gate terminal of the first cascode transistor device.

In another aspect, the negative input node of the system can be coupled to the output node to form a unity gain amplifier.

Another embodiment can include a current mirror system for use within an IC. The system can include a first active device and a second active device each having a gate terminal, a source terminal, and a drain terminal. The source terminals of the first active device and the second active device can be coupled together. A drain terminal of the second active device can be coupled to a current reference unit. A drain terminal of the first active device can include an output node. The system also can include a biasing transistor device including a source terminal coupled to a gate terminal of each of the first and second active devices, a gate terminal coupled to a drain terminal of the second active device, and a drain terminal coupled to a voltage source. The biasing transistor device can be complementary to the first and second active devices.

The first active device can include a first transistor device and a first cascode transistor device. A gate terminal of the first transistor device can be coupled to a gate terminal of the second active device and the source terminal of the biasing transistor device. A gate terminal of the first cascode device can be coupled to a bias voltage. A drain terminal of the first cascode device can include the output node.

The second active device can include a second transistor device and a second cascode transistor device. A gate terminal of the second transistor device can be coupled to a gate terminal of the second cascode transistor device, the gate terminal of the first transistor device, and the source terminal of the biasing transistor device. A drain terminal of the second cascode transistor device can be coupled to the gate terminal of the biasing transistor device.

The system also can include an amplifier. The amplifier can include a non-inverting input node coupled to a drain terminal of the second transistor device, an inverting input node coupled to a drain terminal of the first transistor device, and an output coupled to a gate terminal of the first cascode transistor device. The amplifier can provide the bias voltage to the gate terminal of the first cascode transistor device.

Another embodiment can include a circuit including an input differential pair including a positive input node and a negative input node, wherein the input differential pair includes N-type metal oxide semiconductor (NMOS) devices. The circuit can include a current source coupled to the input differential pair, wherein the current source is configured to provide a predetermined bias current for the circuit, and a cascoded current mirror including P-type metal oxide semiconductor (PMOS) devices. The cascoded current mirror can include a first PMOS device, a second PMOS device, a first cascode PMOS device, and a second cascode PMOS device having an output node. The circuit also can include a biasing NMOS device including a source terminal coupled to a gate terminal of each of the first PMOS device, the second PMOS device, and the second cascode PMOS device, a gate terminal coupled to a drain terminal of the second cascode PMOS device, and a drain terminal coupled to a voltage source.

In one aspect, the input differential pair can be implemented as a cascoded input differential pair including a first input NMOS device coupled in series with a first cascode input NMOS device and a second input NMOS device coupled in series with a second cascode input NMOS device.

The gate terminal of the second cascode PMOS device can be coupled to a bias voltage.

The circuit also can include an amplifier. The amplifier can include a non-inverting input node coupled to a drain terminal of the second PMOS device, an inverting input node coupled to a drain terminal of the first PMOS device, and an output coupled to a gate terminal of the first PMOS cascode device. The output of the amplifier can provide the bias voltage to the gate terminal of the first cascode PMOS device.

The cascoded input differential pair can include a diode-connected NMOS device having a source terminal coupled to the source terminal of each of the first and second input NMOS devices and a drain terminal coupled to a gate terminal of each of the first and second cascode input NMOS devices. The diode-connected transistor can be sized according to a gate-to-source voltage of the input pair transistor devices.

In another aspect, the negative input of the system can be coupled to the output node to form a unity gain amplifier.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to a current mirror and an amplifier for use within an IC. In one or more embodiments, a current mirror circuit configuration is provided that incorporates a biasing mechanism. The biasing mechanism improves the response time of the current mirror circuit configuration. The biasing mechanism also allows the current mirror circuit configuration to interoperate with circuits having high compliance voltage requirements.

In an embodiment, the current mirror circuit configuration can be incorporated into an amplifier system. The amplifier system can be an operational, transconductive type of amplifier characterized by a high open-loop gain and a high output impedance. Further, the amplifier system can be characterized by a differential input coupled with the current mirror circuit configuration to provide a single-ended output. The differential input and the current mirror circuit configuration can include cascoded devices. Inclusion of the biasing mechanism within the current mirror circuit configuration allows the amplifier system to achieve a high level of voltage compliance that is well-suited for operation as a unity gain amplifier and/or buffer amplifier within an IC.

Inclusion of the biasing mechanism within the current mirror circuit configuration also aids in overcoming constraints that arise within amplification systems on the input side when cascoding is employed. Often, cascoding on the input side can result in a reduced input voltage range. The reduced input voltage range can degrade the output capability of the amplifier system, particularly in buffer amplifier configurations.

Figure 1:
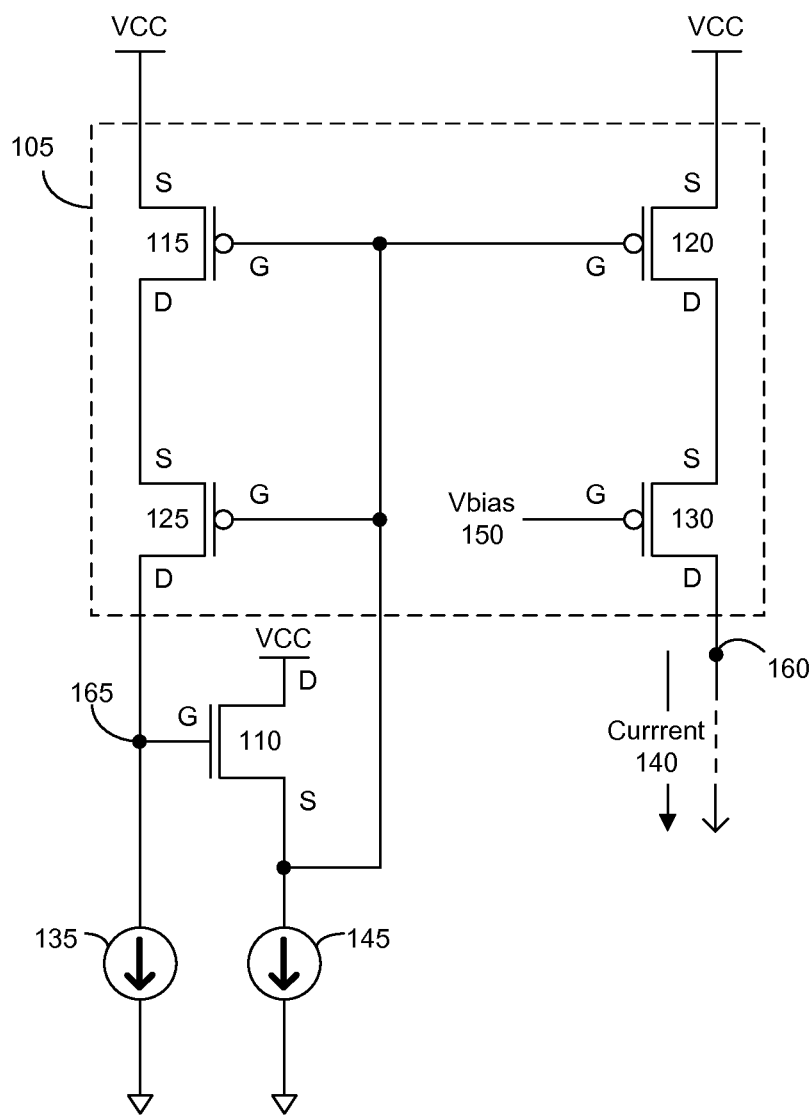
FIG. 1 is a first circuit diagram illustrating a cascoded current mirror system in accordance with an embodiment disclosed within this specification.

FIG. 1 is a first circuit diagram illustrating a cascoded current mirror system (system) 100 in accordance with an embodiment disclosed within this specification. System 100 is implemented as a high-compliance, cascoded current mirror system. As shown, system 100 can include a cascoded current mirror (current mirror) 105 and a biasing device 110. In addition, system 100 includes current sinks (sinks) 135 and 145.

As shown, each of devices 110, 115, 120, 125, and 130 can be implemented in the form of complementary metal oxide semiconductor (CMOS) devices. Devices 115-130 can be implemented in the form of P-type metal oxide semiconductor field effect transistors (MOSFETs). Device 110 can be implemented in the form of an N-type MOSFET.

Current mirror 105 can include a plurality of devices, e.g., transistor devices, such as devices 115 and 120 and a plurality of cascode devices, e.g., cascode transistor devices, such as cascode devices 125 and 130. The source terminal of each of devices 115 and 120 is coupled to a voltage potential VCC. The source terminal of cascode device 125 is coupled to the drain terminal of device 115. In addition, the gate terminal of cascode device 125 is coupled to the gate terminal of each of devices 115 and 120. The source terminal of cascode device 130 is coupled to the drain terminal of device 120.

In general, the term "cascoding" can refer to stacking two transistors of a same device type in series within a signal path of a circuit. The transistor that functions as the output node of the transistor pair is referred to as a "cascode transistor" or a "cascode device." Referring to FIG. 1, for example, cascode device 125 is a cascode device with respect to device 115. Similarly, cascode device 130 is a cascode device with respect to device 120.

When cascoding is implemented within a circuit, an input voltage signal is typically applied to a first transistor device in the cascode structure, e.g., the "non-cascoded device." The first device converts the voltage signal to an output current that flows through the second device. In the example of FIG. 1, the second device provides an output and, thus, can be referred to as the cascode device. A bias voltage is applied to the cascode device in order to bias the cascode device to an operating point at which the cascode device is capable of receiving the signal current from the first transistor device.

Cascoding can be used within electronic circuits as an alternative to using a single transistor. For example, consider the case in which the gate terminal of device 120 receives an input signal and the drain terminal of cascode device 130 serves as an output node, e.g., for an amplifier. For purposes of illustration, the drain terminal of cascode device 130 is labeled as node 160. Without the presence of cascode device 130 the drain terminal of device 120 would serve as the output node for the amplifier. In that case, the output resistance of a node such as the output node, denoted as "Rout," is the output resistance of device 120 taken alone and denoted as "$r_o$."

In general, the resistance of a transistor device from the perspective of looking into the drain terminal is increased by the presence of a resistance in series with the source terminal of the transistor device. The resistance of the source terminal of a transistor device can be denoted as "Rs." Accordingly, Rout of a particular device, e.g., device 120, when looking into the drain terminal is given by the expression Rout=($r_o$ of device 120)*(1/Rs of device 120). Since the source terminal of device 120 is coupled to a power supply VCC, Rs for device 120 is minimal.

In the cascode configuration, device 120 is coupled between the source terminal of cascode device 130 and VCC. As such, the resistance that is now in series with the source terminal of cascode device 130 is $r_o$ of device 120. Thus, when looking into the drain terminal of cascode device 130, Rout is approximately equal to the expression ($r_o$ of cascode device 130)*(gm of cascode device 130)*($r_o$ of device 120), where "gm" represents the transconductance of a device. Cascoding offers a relative improvement in the Rout over the case of a single transistor by a factor of gm*($r_o$ of cascode device 130). Further, since the voltage gain of an amplifier stage is typically a function of the output resistance of the amplifier stage, the increase in Rout provided by cascoding can increase the voltage gain of the amplifier stage in which cascoding is utilized.

Another advantage of cascoding over a single transistor is an improvement in amplifier bandwidth. In amplifiers, a phenomenon known as the "Miller Effect" can account for an increase in the capacitance appearing at the input of a voltage amplifier. Consider a transistor that provides a predetermined gain along a path from the gate terminal of the transistor to the drain terminal of the transistor. The transistor also has a parasitic capacitance associated with the gate-to-drain path. The Miller Effect generally means that the device has an equivalent capacitance that is determined by multiplying the gain times the parasitic capacitance of the device. When viewing the signal path looking into the gate, the parasitic capacitance of the gate-to-drain path is amplified, e.g., multiplied, by the gain of the path. The transistor can have a gain, for example, of 10. Multiplying the parasitic capacitance by the gain results in an equivalent capacitance of 10 times the parasitic capacitance.

Consider, for example, the case of an input voltage signal being applied to the gate terminal of device 120. The input bandwidth of such an amplifier is limited by capacitances residing at the input gate terminal of device 120. The parasitic gate-to-drain capacitance inherent within device 120 can be denoted as Cgd. Cgd generally dominates the other parasitic gate capacitances as a result of the Miller Effect. The Miller Effect effectively increases the equivalent capacitance of Cgd as seen at the gate terminal of device 120 by a factor of the voltage gain across Cgd. The voltage gain from the gate terminal to the drain terminal of such a circuit configuration is the "gm" of device 120 multiplied by Rout seen looking into the drain terminal of device 120, i.e., $r_o$ of device 120. For this reason, a desired increase in output drain resistance for device 120 results in a correlated increase in the equivalent capacitance of Cgd, and thus, a decrease in the bandwidth of device 120.

Inclusion of cascode device 130 in series with device 120 can improve the bandwidth described above. With cascode device 130 included, Rout as seen at the drain terminal of device 120 is the $r_o$ of device 120 in parallel with an input resistance seen looking into the source terminal of cascode device 130. Implemented in this manner, cascode device 130 can be analyzed as a voltage follower having an input resistance that is approximately 1/gm of cascode device 130. Typically, 1/gm of cascode device 130 is significantly lower than $r_o$ of device 120. Accordingly, Rout becomes approximately equal to 1/gm of cascode device 130.

The reduction in Rout at the drain terminal of device 120, as a result of the presence of cascode device 130, reduces the voltage gain from gate-to-drain of device 120. Reduction in voltage gain from gate-to-drain reduces the voltage gain appearing across Cgd of device 120, thereby reducing the equivalent capacitance of Cgd caused by the Miller Effect. As a result, the capacitance appearing at the input, i.e., the gate terminal, of device 120 is reduced. Reduction in the capacitance at the gate terminal of device 120 generally increases input signal bandwidth.

Voltage gain is achieved in the cascode structure at node 160. The signal current generated in device 120 flows into the low impedance input source terminal of cascode device 130 and flows out of the high impedance drain terminal of cascode device 130. The voltage gain from the gate terminal of device 120 to the drain terminal of cascode device 130 is approximately defined by the expression (gm of cascode device 130)*($r_o$ of cascode device 130)*($r_o$ of device 120). From this expression, it can be seen that cascoding can improve both output impedance and voltage gain of system 100, while simultaneously improving the input signal bandwidth.

One disadvantage of cascoding, however, is the additional drain-to-source voltage headroom required from placing two transistors in series. In order to retain a high output resistance at the drain terminal of a CMOS transistor, the transistor must reside within the active or "saturation" region of operation. If the drain-to-source voltage, denoted as Vds, across a transistor device drops below Vgs−Vth, where Vth represents the threshold voltage needed to turn on the transistor device and Vgs represents the gate-to-source voltage, the transistor resides within the linear operating region resulting in a large decrease in the overall Rout of system 100. As such, cascoding requires twice the voltage headroom as compared to a single transistor to ensure that the two transistors remain out of the linear region.

When cascoding is implemented within a current mirror, the voltage headroom required is typically greater since at least one device on one side of the current mirror is a diode-connected device to receive a reference bias current. For example, within a conventional cascoded current mirror, the gate terminal of each of transistor devices 115, 120, and cascode device 125 would be coupled to the drain terminal of cascode device 125 at node 165. Implemented in this manner, device 125 is a diode-connected transistor in series with device 115 with their gates tied together. As such, node 165 forms a low impedance node that sources current to current sink 135. With devices 115 and 125 implemented in this manner, the voltage at node 165 is forced to VCC−(Vgs of device 115). As a result, the compliance voltage for the circuit used to implement current sink 135 cannot be greater than VCC−(Vgs of device 115).

The compliance voltage, in general, refers to a minimum amount of voltage needed for a device, or a collection of devices arranged in a system, for example, to function in an expected or defined manner. For instance, the compliance voltage of a current mirror is the voltage needed in order for the current mirror to function as a current mirror, e.g., within acceptable bounds. Compliance voltage generally is used to refer to the output compliance voltage of a current mirror. In the example presented in FIG. 1, the compliance voltage also refers to the input compliance voltage of the current mirror, i.e., the voltage at node 165.

The addition of device 110 to current mirror 105 shifts the voltage at node 165 up by approximately the Vgs of device 110 from the voltage that otherwise would exist at node 165 when implemented as a conventional current mirror as described. The voltage shift at node 165 that occurs from inclusion of device 110 can reduce the Vds across device 125 to less than the saturation voltage (Vdsat), where Vdsat=Vgs−Vt. Device 115, however, remains in the linear region. In effect, devices 115 and 125 act as a single device in this configuration. In order to decrease the voltage at node 165, device 110 must be of a complementary transistor type to devices 115 and 125. Thus, in the example illustrated in FIG. 1, device 110 is illustrated as an N-type transistor.

Device 110 is coupled to current sink 145. Current sink 145 provides bias current that forces device 110 to a predetermined operating point. Using the quantity of bias current flowing through device 110 and by sizing device 110 properly, the value of Vgs for device 110 and resulting voltage at node 165 can be adjusted as desired. In addition, the inclusion of device 110 isolates the drain terminal of device 125 from the gate terminals of each of devices 115-125. As a result, bias current flowing within devices 115 and 125 is not required to drive the gate terminal of each of devices 115-125.

The increased impedance at node 165 resulting from the addition of device 110 greatly increases the gain within the negative feedback loop around the gate terminal of device 125 through device 110 and back to device 125 from the unity gain feedback loop seen with a conventional diode-connected device. This gain increase results in increased drive to the gate terminals of each of devices 115-125. In addition, when device 110 is properly sized, the gate capacitance that must be charged by device 125 to drive device 110 can be significantly reduced from the gate capacitance that must be driven on the gate terminal of each of devices 115-125 in the conventional cascode current mirror.

The current used by device 110 to drive the gate terminals of each of devices 115-125 flows in the path from device 110 to current sink 145 and not in the path formed by device 115 to device 125 to current sink 135 that is used to bias the reference current sunk by current sink 135 within the current mirror. As a result, device 110 can improve the accuracy of the reference current flowing through devices 115 and 125 as a greater majority of the reference current flowing though current sink 135 flows though devices 115 and 125 as opposed to charging the gate terminals of devices 115 and 120. In addition, device 110 increases the speed at which devices 115-125 can be driven, e.g., switched. Device 110 can drive, e.g., charge and discharge, the capacitive load presented by the gates of devices 115 and 125 by driving significant current responsive to small fluctuations in voltage at the gate of device 110, e.g., at node 165. For example, device 110 can be sized smaller than devices 115-125 so that the gate of device 110 presents a small capacitance requiring less current to drive the gate voltage of device 110, resulting in faster response times for the negative feedback loop.

It should be noted that as the source terminals of each of devices 115 and 120 are coupled, and the gate terminals of each of devices 115 and 120 are coupled, the Vgs of device 115 is equal to the Vgs of device 120. As such, the current flowing within device 120 is a function of the current flowing through device 115. Accordingly, current flowing out of the drain terminal of device 130 through node 160, represented as current 140, is a function of the reference current generated by current sink 135.

For example, when device 115 and 120 are matched and have a same size, current 140 is approximately equal to the reference current generated by current sink 135. The accuracy of the matching between current 140 and the current generated by current sink 135 can be enhanced by implementing each of devices 125 and 130 as matched devices of a same size when equivalence, or substantial equivalence, between current 140 and the current sunk by current sink 135 is desired. Further, by making the size of devices 120 and 130 ratios of the size of devices 115 and 125, respectively, current 140 can be made a ratio of the reference current generated by current sink 135.

Regarding cascode device 130, Vbias 150 can provide sufficient bias voltage to the gate terminal of cascode device 130 to ensure that cascode device 130 turns on. More particularly, Vbias 150 can provide sufficient bias voltage to cascode device 130 to ensure that Vgs of cascode device 130 moves cascode device 130 out of the subthreshold region.

It should be appreciated that the circuit illustrated with reference to FIG. 1 can be implemented using complementary devices, e.g., where devices 115-130 are implemented as N-type devices and device 110 is implemented as a P-type device. In such embodiments, in general, current sinks can become current sources and current sources can become current sinks. From time-to-time within this specification, a current source and/or a current sink can be referred to as a "current reference" or a "current reference unit." Further, though the transistors are illustrated as CMOS devices, other device types can be used. For example, bipolar transistor devices can be used. As such, the one or more embodiments disclosed within this specification are not intended to be limited by the particular examples shown in FIG. 1.

Figure 2:
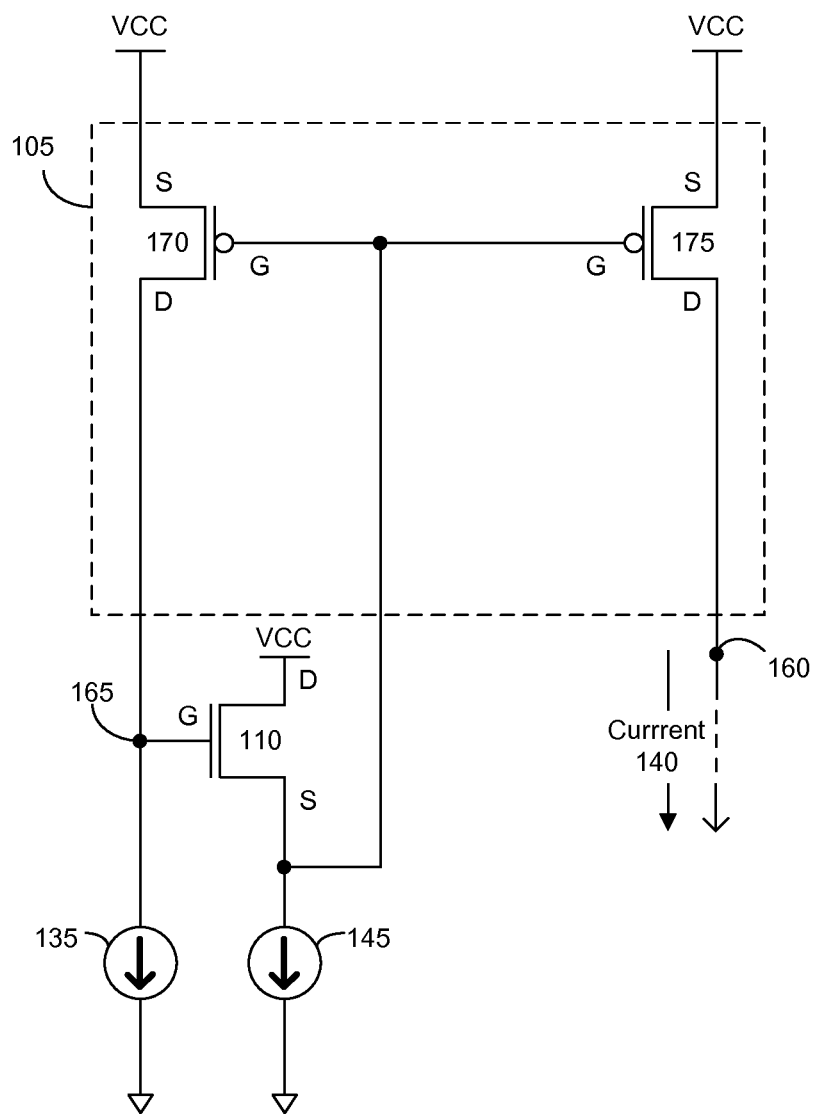
FIG. 2 is a second circuit diagram illustrating a current mirror system in accordance with another embodiment disclosed within this specification.

FIG. 2 is a second circuit diagram illustrating a current mirror system (system) 200 in accordance with another embodiment disclosed within this specification. System 200 is implemented as a high-compliance, current mirror system substantially as described with reference to FIG. 1. Accordingly, like numbers will be used to refer to the same items throughout this specification to the extent possible.

FIG. 2 illustrates an alternative embodiment in which device 115 and cascode device 125 of FIG. 1 are replaced with a single active device 170, e.g., a transistor, and device 120 and cascode device 130 are replaced with another single active device 175, e.g., another transistor. Thus, cascoding need not be applied on either leg of system 200. As shown, the gate terminal of active device 170 can be coupled to the gate terminal of active device 175 and the source terminal of device 110. The source terminal of active device 170 can be coupled to VCC and the drain terminal can be coupled to node 165. The source terminal of active device 175 can be coupled to VCC and the drain terminal to node 160, e.g., providing an output.

The input compliance of system 200 can approach VCC. The output compliance of system 200, e.g., without cascoding, is VCC-(Vdsat of device 175). By comparison, the cascoded configuration shown as system 100 in FIG. 1 reduces the output compliance by the Vdsat of cascode device 130. For example, the output compliance becomes VCC-2*Vdsat. The input compliance approaches VCC.

Figure 3:
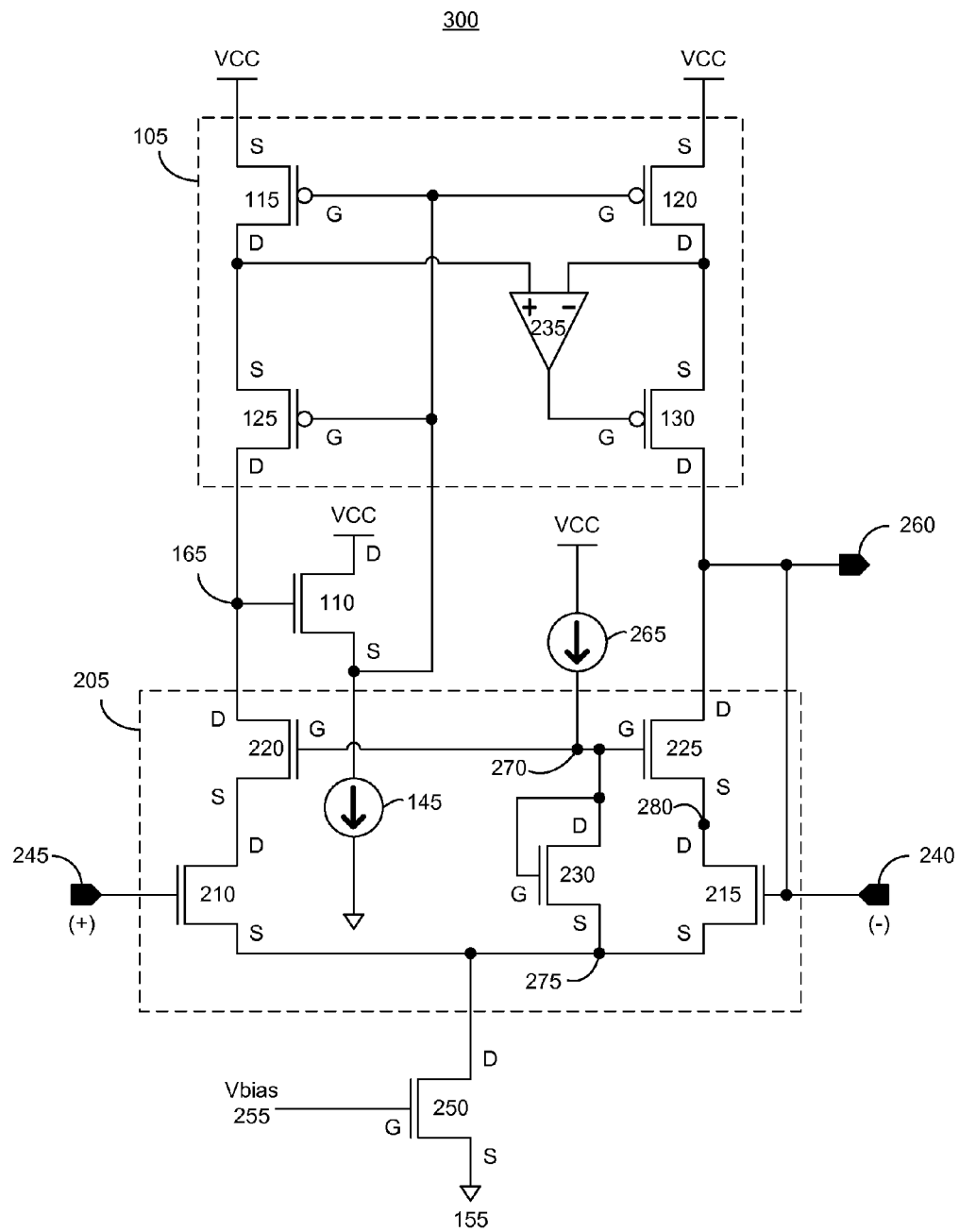
FIG. 3 is a third circuit diagram illustrating a cascoded single-stage amplifier system in accordance with another embodiment disclosed within this specification.

FIG. 3 is a third block diagram illustrating a cascoded single-stage amplifier system (system) 300 in accordance with another embodiment disclosed within this specification. System 300 incorporates aspects described with reference to FIGS. 1-2 and can be implemented as a high-compliance amplifier system. As noted, like numbers will be used to refer to the same items throughout this specification. In general, system 300 can include current mirror 105, device 110, a cascoded differential input block (input block) 205, and a current sink 250.

Input block 205 can include devices 210, 215, 220, 225, and 230. Device 210 and cascode device 220 are coupled in series and form a first cascoded input of system 300. The gate terminal of device 210, e.g., node 245, can function as the positive input. Device 215 and cascode device 225 are coupled in series and form a second cascoded input of system 300. The gate terminal of device 215, e.g., node 240, can function as the negative input. The use of cascoded devices as the inputs to system 300 provides the same or similar advantages to the inputs of system 300 as described with reference to the cascode current mirror 105 initially described with reference to FIG. 1.

For example, the output resistance at node 260, which is the output terminal for system 300, is equal to the output resistance looking into the drain of cascode device 130 in parallel with the output resistance looking into the drain terminal of cascode device 225. As cascoding increases the output resistance of cascode device 130, cascoding increases the output resistance of cascode device 225. In addition, with the gain of system 300 being a function of the gm of input device 210 and cascode device 220 and Rout at node out 260, increasing Rout by cascoding the differential inputs of block 205 increases the gain of system 300.

Cascoding inputs 240 and 245 also decreases the voltage gain from the gate terminal to the drain terminal of devices 210 and 215. The gain decrease across devices 210 and 215 decreases the Miller Effect on the equivalent capacitance of Cgd for each of devices 210 and 215. The resulting decrease in the equivalent capacitance for Cgd increases the input bandwidth of devices 210 and 215 and, as a result, increases the input bandwidth of system 300.

A source terminal of device 230 is coupled to the source terminal of each of devices 210 and 215. The gate and drain terminals of device 230 are coupled to the gate terminal of each of cascode devices 220 and 225. Accordingly, device 230 is a diode-connected type of device. A bias current can be sourced by current source 265 that biases device 230 to a predetermined operating point. Using the quantity of bias current provided to device 230 and sizing device 230 appropriately, the Vgs of device 230 can be set to assure that devices 210 and 215 remain in the saturation region throughout operation of circuit 300.

For example, the voltage at node 270 is substantially equal to (the voltage at node 275)+(Vgs of device 230). The voltage at node 280 is substantially equal to (the voltage at node 270)−(Vgs of cascode device 225). To ensure that device 215 remains in the saturation region during operation, the Vds across device 215 must remain greater than (Vgs−Vth of device 215). Accordingly, the voltage at node 280 minus the voltage at node 275 must be greater than (Vgs−Vth of device 215).

When device 230 is biased and sized to assure that the minimum Vgs of device 230 is greater than the (Vgs of cascode device 225)+(Vdsat of device 215), device 215 is assured of remaining in the saturation region during operation of system 300. When device 210 is a same size as device 215, and cascode device 220 is a same size as cascode device 225, device 210 is also assured of remaining in saturation region during operation of system 300. In order for system 300 to function as a linear amplifier, devices 210 and 215 must remain in the saturation region of operation.

The drain of current sink 250 is coupled to the source terminal of each of devices 210 and 215. Current sink 250 receives a bias voltage Vbias 255 that establishes the operating point of, and current flowing within, current sink 250. The current sunk by current sink 250 provides the bias current that flows within system 300. This bias current flows evenly though devices 210 and 215 when nodes 240 and 245 are balanced and held at a same DC voltage. As the differential voltage applied to nodes 240 and 245 varies, the current distribution between each of devices 210 and 215 also varies. For example, as the voltage applied to node 240 becomes greater than the voltage applied to node 245, more current begins to flow through device 210 than device 215.

Referring to FIG. 3, the drain terminal of cascode device 220 within input block 205 is coupled to the drain terminal of cascode device 125 within current mirror 105. As such, the current sunk by cascode device 220 serves as the reference current source for current mirror 105. This current flows through cascode device 125 and device 115 and is mirrored over to device 120 which, being coupled to device 115 at source and gate terminals, has a same Vgs as device 115. When devices 115 and 120 are matched and cascode devices 125 and 130 are matched, the current flowing through the drain terminal of device 115 is approximately equal to the current flowing out of the drain terminal of device 120.

Within actual transistors, although a same Vgs is applied across two matched devices, the finite drain-to-source resistance of the devices can generate differing currents within the devices when Vds across the devices differs. For example, although coupling the gate terminals and coupling the source terminals of devices 115 and 120 assures that the Vgs of each device is identical, differing voltage potentials at the drain terminal of each device can result in current mismatches between devices 115 and 120.

In order to improve the current matching between devices 115 and 120, amplifier 235 is included within current mirror 105. Referring to FIG. 3, the inverting input of amplifier 235 is coupled to the drain terminal of device 120 and the source terminal of cascode device 130. The non-inverting input of amplifier 235 is coupled to the drain terminal of device 115 and the source terminal of cascode device 125. The output of amplifier 235 is coupled to the gate terminal of cascode device 130 and provides a bias voltage to cascode device 130.

Implemented in this manner, a negative feedback loop is formed from the negative input of amplifier 235, through amplifier 235, to the gate terminal of cascode device 130, through the source terminal of cascode device 130, and back to the inverting input of amplifier 235. The feedback path generates an error signal at the inverting input of amplifier 235 that attempts to set the operating point of cascode device 130 by forcing the voltage at the inverting and non-inverting inputs of amplifier 235 to be equal. As a result, the voltage at the drain terminal of device 120 is driven to be equal to the voltage at the drain terminal of device 115. Setting the drain terminal of each of devices 115 and 120 to a same voltage potential further enhances the current matching within the two legs of current mirror 105.

In addition, by balancing the voltages at the drain terminal of each of devices 115 and 120, devices 115 and 120 can be operated in the linear region without impacting the current matching between devices 115 and 120. It follows that without the requirement to retain device 120 in the saturation region, only cascode device 130 need remain in the saturation region. Accordingly, node 260 can be as high as VCC−(Vdsat of cascode device 130) without impacting operation of the circuit. It should be noted that for proper circuit response, amplifier 235 preferably is designed with the current driving capability required to charge and discharge the capacitance of the gate terminal of cascode device 130 responsive to the frequency of the input signal received by system 300.

Continuing with FIG. 3, the current sunk by device 220 is matched and folded over to be sourced by cascode device 130. As such, the differential current on the two sides of system 300 is folded over into opposing single ended currents at node 260. As shown, node 260 is coupled to node 240. Coupled in this manner, system 300 forms a unity gain amplifier. Coupling nodes 240 and 260 forms an implementation that can be used in modern ICs to implement buffers and drivers for signals within the IC. Many of these signals require the amplifier to buffer signals having voltages that are substantially close to the voltages of the supply rails powering system 300.

In that case, the input and the output of system 300 must be capable of receiving voltages close to the supply voltage without driving selected devices, e.g., devices 210 and 220, within system 300 into the linear region of operation. For example, consider an amplifier using cascoded inputs and a conventional cascoded current mirror as a load. In that case, the gates of devices 115, 120, and cascoded device 125 would be coupled to the drain terminal of cascode device 125. With cascode device 125 configured as a diode and the gate of device 115 connected to the gate of cascode device 125, the voltage at node 165 would be equal to VCC−(Vgs of device 115).

As node 245 is driven high, the voltage at node 275 is Vin−(Vgs of device 210) or |Vin|−((Vdsat of device 210)+(Vth of device 210)). Vin can represent the input voltage signal, e.g., node 245. For proper operation of system 300, both of devices 210 and 215 must remain in the saturation region of operation. Stated differently, the Vds across each of devices 210 and 215 must be greater than the Vdsat of each device. As the voltage at input 245 approaches VCC, the voltage across devices 210 and 220, i.e., (the voltage at node 165)−(the voltage at node 275), must be greater than the Vdsat of device 210 plus the Vdsat of cascode device 220. Setting node 245 equal to VCC, the voltage at node 165 minus the voltage at node 275 is equal to (Vcc−Vgs of device 115)−(Vcc−Vgs of device 210)=(Vgs of device 115)−(Vgs of device 210). Thus, in a conventional configuration where the gates of devices 115-125 are coupled to node 165, as Vin approaches VCC−2Vdsat, there is no assurance that devices 220 and 210 are not in the linear region. The lack of assurance holds despite the fact that in most CMOS device processes, Vth of a P-type device is slightly larger than Vth of an N-type device particularly when taking into consideration temperature and process variation.

When driven into the linear region, the output impedance of cascode device 220 collapses and cascode device 220 behaves more like a simple resistor. With device 115 and cascode device 125 diode-connected, noise appearing on VCC is injected directly into node 165. When operated in saturation region, the high output impedance of cascode device 220 isolates the drain terminal of device 210 from the noise at node 165. However, when operating in linear region, the isolation provided by cascode device 220 collapses and most of the noise injected into node 165 appears at the drain terminal of device 210.

This noise voltage injected into node 165 can modulate the drain-to-source voltage of device 210 and appear as noise current within device 210. As the noise current is applied to only one side of the conventional cascode current mirror, the noise voltage presents itself as a differential-mode signal at the input of system 300. Accordingly, supply noise can appear as part of the differential output signal. Thus, when device 220 moves into the linear region of operation, the power supply rejection of a circuit using the conventional cascode current mirror as a load deteriorates.

The use of device 210 moves the voltage at node 165 higher by the Vgs of device 210, thereby assuring that cascode device 220 remains in the saturation region of operation as node 245 moves closer to VCC. As a result, the power supply rejection of system 300, which itself implements a single-stage amplifier design, when used as a unity gain rail-to-rail buffer, is greatly increased from that of a single-stage amplifier using the conventional cascode current mirror as an active load.

Similarly, when cascode device 220 operates in linear region, common mode signals applied to input stage 205 can be converted to differential signals by the imbalance in input stage 205 created by cascode device 220 going out of saturation. Stated differently, proper operation of a differential circuit, e.g., input stage 205, depends upon the matching symmetry between each side of the circuit to ensure that the signal applied to each of the differential inputs is processed identically. In the case of input stage 205, differential integrity requires that the input impedance looking into the gate of device 210 is matched to the input impedance looking into the gate of device 215. Similarly, the output impedance looking into the drain of cascode device 220 is to be matched to the output impedance looking into the drain of cascode device 225. In addition, the transconductance of each of devices 210 and 215 is matched.

When cascode device 220 resides in the linear region of operation while cascode device 225 resides in the saturation region, the output impedances of the two sides of input stage 205 are unbalanced. As a result, noise at node 165 can modulate the signal current flowing through cascode device 220 on only one side of input stage 205, thereby converting the noise to a differential signal. Similarly, the asymmetry in input stage 205 caused by the differing output impedances can result in common mode signals appearing at each of nodes 245 and 240 being amplified unequally, with the difference between the two appearing as a differential signal to system 300. In consequence, a severe reduction in the common mode rejection ratio can occur.

Again, the use of device 110 assures that cascode device 220 remains in the saturation region as node 245 approaches VCC. In this manner, device 110 provides improved power supply and common mode rejection levels than are attainable in a single-stage amplifier that utilizes a conventional cascode current mirror as an active load.

Figure 4:
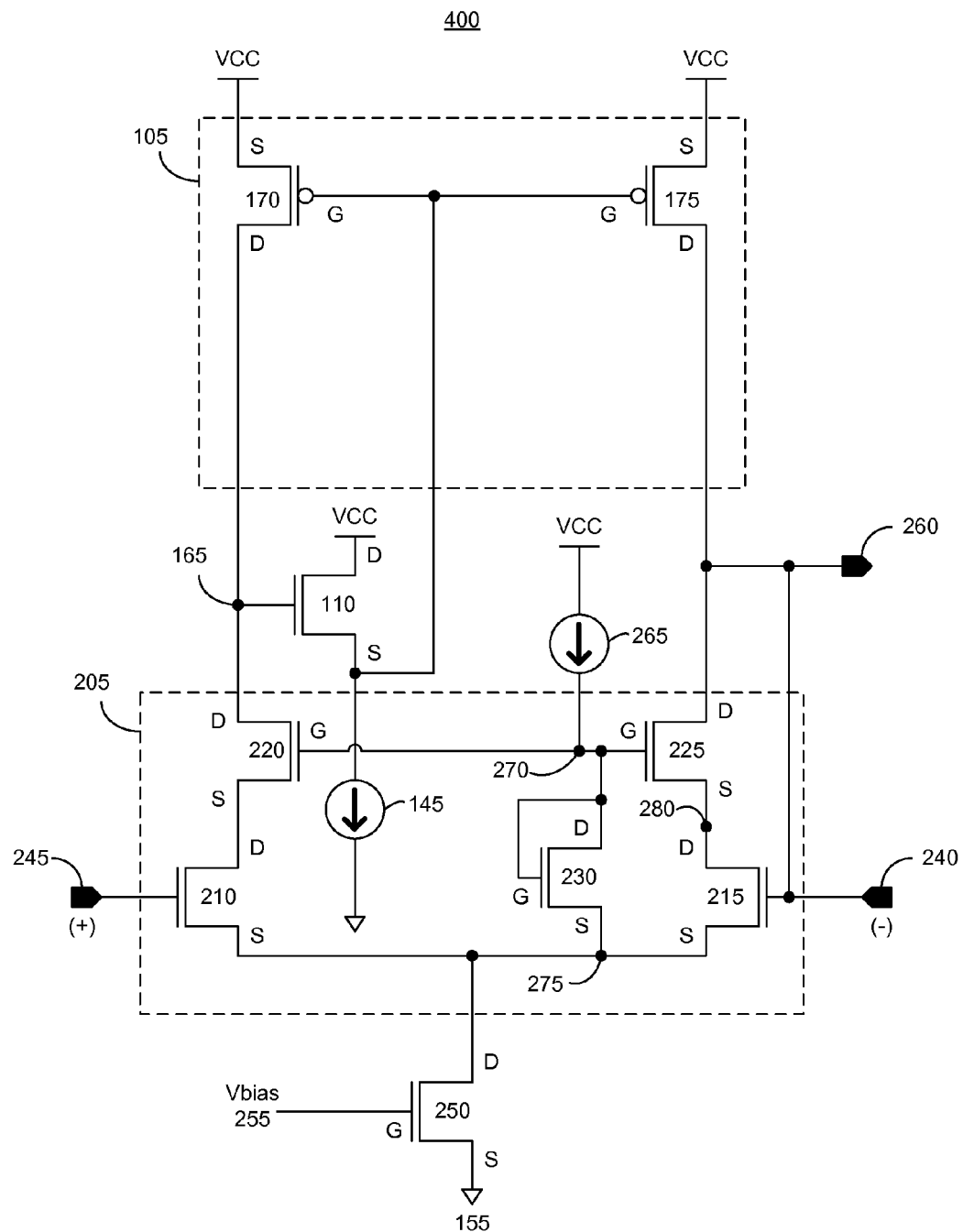
FIG. 4 is a fourth circuit diagram illustrating a single-stage amplifier system in accordance with another embodiment disclosed within this specification.

FIG. 4 is a fourth circuit diagram illustrating a single-stage amplifier system (system) 400 in accordance with another embodiment disclosed within this specification. System 400 incorporates aspects of the amplifier and current mirror configurations described with reference to FIGS. 1-3. As such, system 400 implements a high-compliance amplifier system. As noted, like numbers will be used to refer to the same items throughout this specification. In general, system 400 can include current mirror 105, device 110, cascoded differential input block (input block) 205, and current sink 250. FIG. 4, however, unlike FIG. 3, illustrates an embodiment in which a non-cascoded version of current mirror 105 is utilized as described with reference to FIG. 2.

Figure 5:
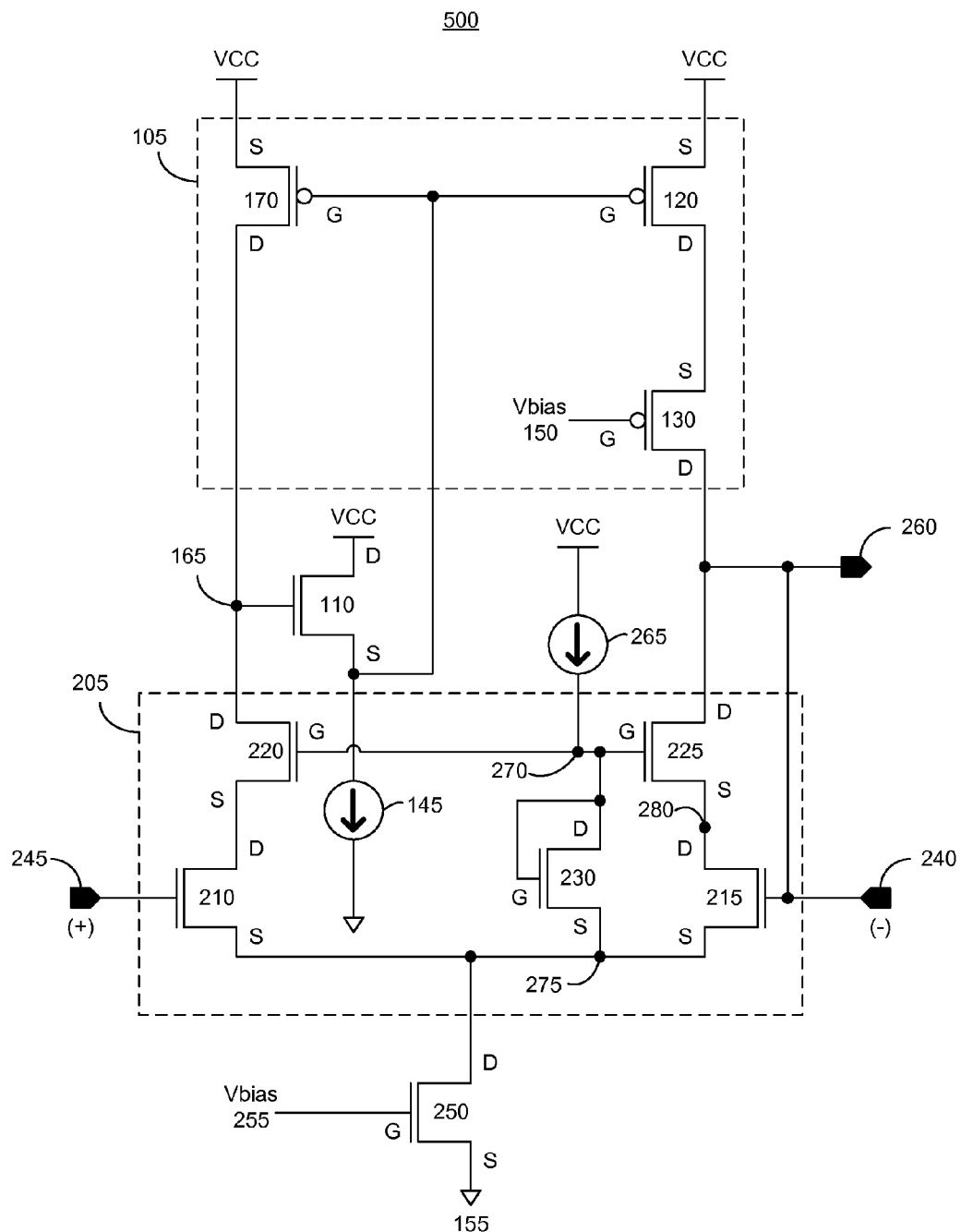
FIG. 5 is a fifth circuit diagram illustrating a single-stage amplifier system in accordance with another embodiment disclosed within this specification.

FIG. 5 is a fifth circuit diagram illustrating a single-stage amplifier system (system) 500 in accordance with another embodiment disclosed within this specification. System 500 incorporates aspects of the amplifier and current mirror configurations described with reference to FIGS. 1-4. As such, system 500 implements a high-compliance amplifier system. As noted, like numbers will be used to refer to the same items throughout this specification. In general, system 500 can include current mirror 105, device 110, cascoded differential input block (input block) 205, and current sink 250.

As pictured in FIG. 5, devices 115 and 125 are replaced with a single active device 170. The opposing leg of current mirror 105 is cascoded. As shown, the gate terminal of device 130 is coupled to a bias voltage, e.g., Vbias 150. The source terminal of cascode device 130 is coupled to the drain terminal of device 120. The drain terminal of cascoded device 130 can provide, or be coupled to, output node 260.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A system for use within an integrated circuit, the system comprising:
    an input differential pair comprising a first input transistor device coupled in series with a first cascode input transistor device, and a second input transistor device coupled in series with a second cascode input transistor device, wherein a positive input node is coupled to a gate of the first input transistor device and a negative input node is coupled to a gate of the second input transistor device;
    a current source coupled to a gate of the first cascode input transistor device and a gate of the second cascode input transistor device, wherein the current source provides a predetermined bias current;
    a biasing field effect transistor device comprising a source terminal, a gate terminal, and a drain terminal, wherein the drain terminal is coupled to a voltage source; and
    a current mirror comprising a first active device and a second active device, wherein the first active device comprises a first transistor device, and the second active device comprises a second transistor device;
    wherein the biasing field effect transistor device is of a different doping type from that of the current mirror; and
    wherein a gate terminal of the first transistor device and a gate terminal of the second transistor device are coupled to the source terminal of the biasing field effect transistor device.

2. The system of claim 1, wherein the input differential pair further comprises:
    a diode-connected field effect transistor comprising a source terminal coupled to a source terminal of each of the first and second input transistor devices and a drain terminal coupled to the gate terminal of each of the first and second cascode input transistor devices.

3. The system of claim 2, wherein the diode-connected field effect transistor is sized according to a gate-to-source voltage of the first and second cascode input transistor devices.

4. The system of claim 1, further comprising an amplifier, wherein:
    the amplifier comprises a non-inverting input node coupled to a drain terminal of the second transistor device, an inverting input node coupled to a drain terminal of the first transistor device, and an output coupled to a gate terminal of a first cascode transistor device; and
    the amplifier provides the bias voltage to the gate terminal of the first cascode transistor device.

5. The system of claim 1, wherein the negative input node is coupled to an output node at a drain terminal of a cascode transistor device to form a unity gain amplifier.

6. The system of claim 1, wherein:
    the first input transistor device, the first cascode input transistor device, the second input transistor device, and the second cascode input transistor device are N-type metal oxide semiconductor (NMOS) devices; and
    the first transistor device and the second transistor device are P-type metal oxide semiconductor (PMOS) devices.

7. The system of claim 1, wherein the first active device also comprises a first cascode transistor device, and the second active device also comprises a second cascode transistor device; and
    wherein a gate terminal of the first cascode transistor device is coupled to an amplifier that provides a bias voltage.

8. The system of claim 1, wherein the first active device also comprises a first cascode transistor device, and the second active device also comprises a second cascode transistor device; and
    wherein a drain terminal of the second cascode transistor device is coupled to the gate terminal of the biasing field effect transistor.

9. A current mirror system for use within an integrated circuit, the system comprising:
    a first active device and a second active device each comprising a gate terminal, a source terminal, and a drain terminal;
    wherein the source terminals of the first active device and the second active device are coupled together;
    wherein a drain terminal of the second active device is coupled to a current reference unit;
    wherein a drain terminal of the first active device comprises an output node; and
    a biasing transistor device comprising a source terminal coupled to a gate terminal of each of the first and second active devices, a gate terminal coupled to a drain terminal of the second active device, and a drain terminal coupled to a voltage source,
    wherein the biasing transistor device is complementary to the first and second active devices, and is of a different doping type from that of the first and second active devices.

10. The system of claim 9, wherein:
    the first active device comprises a first transistor device and a first cascode transistor device;

a gate terminal of the first transistor device is coupled to a gate terminal of the second active device and the source terminal of the biasing transistor device;

a gate terminal of the first cascode device is coupled to a bias voltage; and a drain terminal of the first cascode device comprises the output node.

11. The system of claim 10, wherein:

the second active device comprises a second transistor device and a second cascode transistor device;

a gate terminal of the second transistor device is coupled to a gate terminal of the second cascode transistor device, the gate terminal of the first transistor device, and the source terminal of the biasing transistor device; and a drain terminal of the second cascode transistor device is coupled to the gate terminal of the biasing transistor device.

12. The system of claim 11, further comprising an amplifier, wherein:

the amplifier comprises a non-inverting input node coupled to a drain terminal of the second transistor device, an inverting input node coupled to a drain terminal of the first transistor device, and an output coupled to a gate terminal of the first cascode transistor device; and the amplifier provides the bias voltage to the gate terminal of the first cascode transistor device.

13. The system of claim 9, wherein the biasing transistor device is sized according to a compliance voltage for the cascoded current mirror.

14. A circuit, comprising:

an input differential pair comprising a positive input node and a negative input node, wherein the input differential pair comprises N-type metal oxide semiconductor (NMOS) devices;

a current source coupled to the input differential pair, wherein the current source is configured to provide a predetermined bias current for the circuit;

a cascoded current mirror comprising P-type metal oxide semiconductor (PMOS) devices, the cascoded current mirror comprising a first PMOS device, a second PMOS device, a first cascode PMOS device, and a second cascode PMOS device having an output node; and a biasing NMOS device comprising a source terminal coupled to a gate terminal of each of the first PMOS device, the second PMOS device, and the second cascode PMOS device, a gate terminal coupled to a drain terminal of the second cascode PMOS device, and a drain terminal coupled to a voltage source.

15. The circuit of claim 14, wherein the input differential pair is implemented as a cascoded input differential pair comprising a first input NMOS device coupled in series with a first cascode input NMOS device and a second input NMOS device coupled in series with a second cascode input NMOS device.

16. The circuit of claim 15, wherein the cascoded input differential pair further comprises a diode-connected NMOS device comprising a source terminal coupled to the source terminal of each of the first and second input NMOS devices and a drain terminal coupled to a gate terminal of each of the first and second cascode input NMOS devices.

17. The circuit of claim 16, wherein the diode-connected NMOS device is sized according to a gate-to-source voltage of the input pair transistor devices.

18. The circuit of claim 14, wherein the gate terminal of the second cascode PMOS device is coupled to a bias voltage.

19. The circuit of claim 18, further comprising an amplifier, wherein:

the amplifier comprises a non-inverting input node coupled to a drain terminal of the second PMOS device, an inverting input node coupled to a drain terminal of the first PMOS device, and an output coupled to a gate terminal of the first PMOS cascode device; and the output of the amplifier provides the bias voltage to the gate terminal of the first cascode PMOS device.

20. The circuit of claim 14, wherein the negative input node is coupled to the output node to form a unity gain amplifier.

* * * * *